United States Patent
Kim et al.

(10) Patent No.: US 9,401,360 B2
(45) Date of Patent: Jul. 26, 2016

(54) SEMICONDUCTOR DEVICES INCLUDING ETCHING STOP FILMS

(71) Applicants: Jong Pil Kim, Hwaseong-si (KR); Woncheol Jeong, Yongin-si (KR)

(72) Inventors: Jong Pil Kim, Hwaseong-si (KR); Woncheol Jeong, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/859,764

(22) Filed: Sep. 21, 2015

(65) Prior Publication Data

US 2016/0013188 A1 Jan. 14, 2016

Related U.S. Application Data

(63) Continuation of application No. 13/243,338, filed on Sep. 23, 2011, now Pat. No. 9,209,087.

(30) Foreign Application Priority Data

Oct. 13, 2010 (KR) .................. 10-2010-0099954

(51) Int. Cl.
*H01L 29/49* (2006.01)
*H01L 27/092* (2006.01)
*H01L 21/8238* (2006.01)
*H01L 23/528* (2006.01)
*H01L 23/532* (2006.01)

(52) U.S. Cl.
CPC ...... *H01L 27/092* (2013.01); *H01L 21/823807* (2013.01); *H01L 21/823814* (2013.01); *H01L 23/528* (2013.01); *H01L 23/53295* (2013.01)

(58) Field of Classification Search
CPC .............. H01L 27/092; H01L 21/823807; H01L 21/823814; H01L 23/528; H01L 23/53295

See application file for complete search history.

(56) References Cited

U.S. PATENT DOCUMENTS

| | | | |
|---|---|---|---|
| 7,615,426 B2 | 11/2009 | Wang et al. | |
| 7,968,952 B2 * | 6/2011 | Fischer | H01L 21/76843 257/382 |
| 8,362,367 B2 * | 1/2013 | Komatsu | H05K 3/388 174/262 |
| 2003/0059995 A1 | 3/2003 | Hsu | |
| 2013/0005134 A1 * | 1/2013 | Tamura | H01L 21/823807 438/595 |
| 2013/0011975 A1 * | 1/2013 | Cheng | H01L 29/78654 438/151 |
| 2013/0040462 A1 * | 2/2013 | Liu | H01L 21/30608 438/696 |
| 2013/0075820 A1 * | 3/2013 | Scheiper | H01L 21/76232 257/368 |

FOREIGN PATENT DOCUMENTS

| | | |
|---|---|---|
| JP | 08-008208 | 1/1996 |
| JP | 2003-158200 | 5/2003 |
| KR | 100187672 | 1/1999 |

* cited by examiner

*Primary Examiner* — Michael Shingleton
(74) *Attorney, Agent, or Firm* — Myers Bigel & Sibley, P.A.

(57) ABSTRACT

A semiconductor device may include a substrate including an NMOS region and a PMOS region. A gate structure can include a gate pattern and a spacer pattern, where the gate structure is on the substrate. A first etching stop film can be on the substrate in the NMOS region and a second etching stop film can be on the substrate in the PMOS region. A contact hole can penetrate the first and second etching stop films and a contact plug can be in the contact hole. A thickness of the first etching stop film can be greater than a thickness of the second etching stop film. Related methods are also disclosed.

20 Claims, 19 Drawing Sheets

SEMICONDUCTOR DEVICES INCLUDING ETCHING STOP FILMS

CROSS-REFERENCE TO RELATED APPLICATIONS

This application is a continuation of U.S. patent application Ser. No. 13/243,338, filed Sep. 23, 2011, which claims priority to Korean Patent Application No. 10-2010-0099954, filed on Oct. 13, 2010, in the Korean Intellectual Property Office, the disclosures of which are hereby incorporated herein by reference in their entirety.

BACKGROUND

The present inventive concept herein relates to semiconductor devices and methods of manufacturing the same.

Semiconductor devices may be classified into semiconductor memory devices, semiconductor operation devices, and hybrid semiconductor devices including a memory and logic elements. As the electronics industry has developed, the need for increased reliability, speed, and functionality of semiconductor devices has gradually increased.

SUMMARY

Embodiments of the inventive concept provide semiconductor devices including etching stop film and methods of manufacturing the same. Pursuant to these embodiments, a semiconductor device may include a substrate including an NMOS region and a PMOS region. A gate structure can include a gate pattern and a spacer pattern, where the gate structure is on the substrate. A first etching stop film can be on the substrate in the NMOS region and a second etching stop film can be on the substrate in the PMOS region. A contact hole can penetrate the first and second etching stop films and a contact plug can be in the contact hole. A thickness of the first etching stop film can be greater than a thickness of the second etching stop film.

In some embodiments of the inventive concept, a method may include forming a gate structure on a substrate including an NMOS region and a PMOS region and forming first and second etching stop films on the NMOS region and the PMOS region, respectively. The first and second etching stop films can be provided by diffusing at least one of nitrogen atoms and carbon atoms into the NMOS region and the PMOS region exposed by the gate structure.

In some embodiments of the inventive concept, a method of manufacturing a semiconductor device can include forming source/drain regions in a substrate adjacent to gate structures thereon. Spacers can be formed on sidewalls of the gate structures and a first etching stop film can be formed on the source/drain regions that are associated with first ones of the gate structures to a first thickness and a second etching stop film can be formed on the source/drain regions associated with second ones of the gate structures to a second thickness that is less than the first thickness.

In some embodiments of the inventive concept, forming the source/drain regions in the substrate adjacent to gate structures thereon can be provided by forming a semiconductor extension layer on a source/drain region in an NMOS region of the substrate and forming a compression stress pattern on a source/drain region in an PMOS region of the substrate.

In some embodiments of the inventive concept, forming the first etching stop film and the second etching stop film can be provided by forming the first and second etching stop films simultaneously. In some embodiments of the inventive concept, forming the first and second etching stop films simultaneously can be included by diffusing at least one of nitrogen atoms and carbon atoms into the source/drain region in the NMOS region to form the semiconductor extension layer and diffusing at least one of the nitrogen atoms and the carbon atoms into the source/drain region in the PMOS region to form the compression stress pattern.

In some embodiments of the inventive concept, forming the compression stress pattern can be provided by forming the compression stress pattern to include silicon-germanium, where a silicon concentration in a lower portion of the compression stress pattern is less than a silicon concentration in an upper portion of the compression stress pattern.

DETAILED DESCRIPTION OF EMBODIMENTS ACCORDING TO THE INVENTIVE CONCEPT

Figure 1:
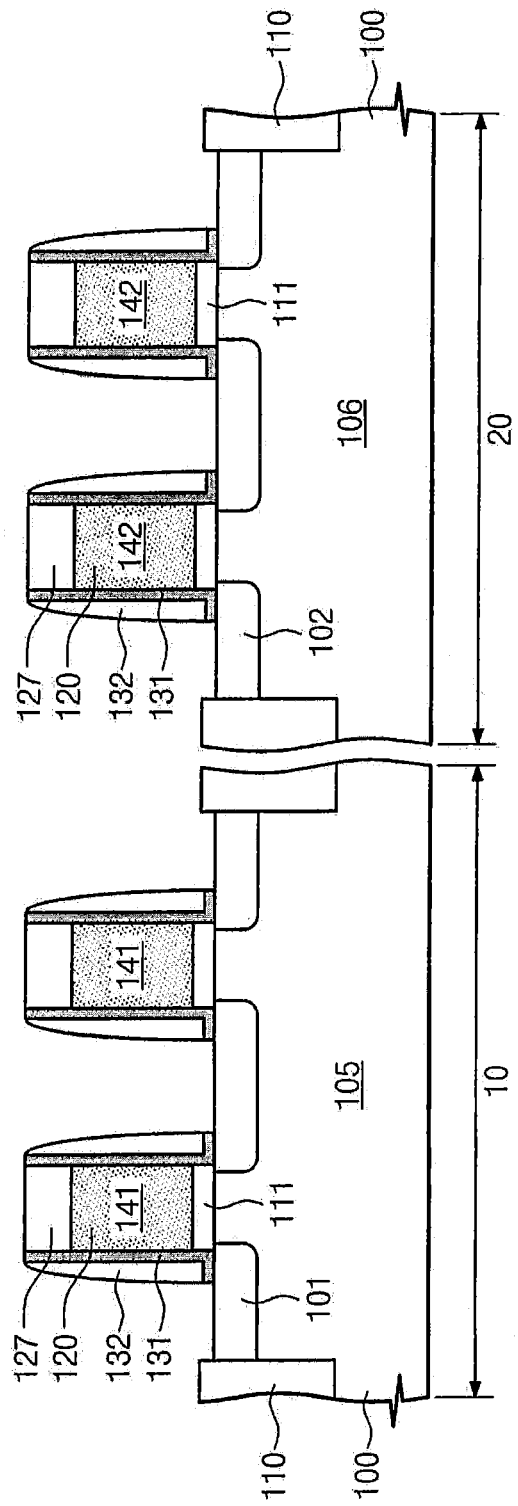
FIGS. 1 through 11 are cross sectional views for explaining semiconductor devices and methods of manufacturing semiconductor devices in accordance with embodiments of the inventive concept.

Preferred embodiments of the inventive concept will be described below in more detail with reference to the accompanying drawings. The embodiments of the inventive concept may, however, be embodied in different forms and should not be constructed as limited to the embodiments set forth herein. Rather, these embodiments are provided so that this disclosure will be thorough and complete, and will fully convey the scope of the inventive concept to those skilled in the art. Like numbers refer to like elements throughout.

In the drawings, the thickness of layers and regions are exaggerated for clarity. It will also be understood that when an element such as a layer, region or substrate is referred to as being "on" or "onto" another element, it may lie directly on the other element or intervening elements or layers may also be present. Like reference numerals refer to like elements throughout the specification.

It will be understood that, although the terms first, second, etc. may be used herein to describe various elements, these elements should not be limited by these terms. These terms are only used to distinguish one element from another. For example, a first region/layer could be termed a second region/layer, and, similarly, a second region/layer could be termed a first region/layer without departing from the teachings of the disclosure.

FIGS. 1 through 11 are cross sectional views for explaining semiconductor devices and methods of manufacturing semiconductor devices in accordance with embodiments of the inventive concept.

Referring to FIG. 1, a substrate 100 including a first transistor region 10 and a second transistor region 20 may be provided. The substrate 100 may be a substrate including semiconductor material. The substrate 100 may be a silicon substrate, a germanium substrate or a silicon-germanium substrate. The first transistor region 10 may be an NMOS region and the second transistor region 20 may be a PMOS region. A device isolation pattern 110 is formed in the substrate 100 to define a first active portion 105 in the first transistor region 10 and a second active portion 106 in the second transistor region 20. The device isolation pattern 110 may be formed by a trench device isolation method. As an illustration, the device isolation pattern 110 may fill a trench formed in the substrate 100. The first active portion 105 may be doped with a first conductivity type impurity and the second active portion 106 may be doped with a second conductivity type impurity. As an illustration, the first conductivity type impurity may be a p-type impurity and the second conductivity type impurity may be an n-type impurity.

Dummy gate structures may be formed on the substrate 100. The dummy gate structures may include a first dummy gate structure 141 provided on the first transistor region 10 and a second dummy gate structure 142 provided on the second transistor region 20. The first and second dummy gate structures 141 and 142 may include a gate pattern and a spacer pattern. The gate pattern may include a gate insulating pattern 111, a dummy gate electrode 120 and a dummy hard mask pattern 127 that are sequentially stacked on the substrate 100. The gate pattern may be formed by sequentially forming a gate insulating layer and a dummy gate electrode layer on the substrate 100, and then patterning the gate insulating layer and the dummy gate electrode layer using the dummy hard mask pattern 127 as an etching mask. The dummy hard mask pattern 127 may include a silicon oxide film, a silicon nitride film and/or a silicon oxynitride film. The gate insulating layer may include a multi-level insulating layer. For example, the gate insulating layer may include at least one of a hafnium oxide film (HfOx), a tantalum oxide film (TaOx) and a silicon oxide film (SiO$_2$) having high dielectric constant. The gate insulating layer may be formed by at least one of a chemical vapor deposition (CVD) method, an atomic layer deposition (ALD) method and a rapid temperature processing (RTP) method. The dummy gate electrode layer may include polysilicon. The dummy gate electrode layer may be formed by a chemical vapor deposition (CVD) method.

A spacer pattern may be formed on a sidewall of the gate pattern. The spacer pattern may include a first spacer 131 and a second spacer 132 that are sequentially stacked on the sidewall of the gate pattern. The first spacer 131 may include a sidewall portion extending along the sidewall of the gate pattern and a bottom portion extending along a top surface of the substrate 100. The second spacer 132 may be spaced apart from the sidewall of the gate pattern and the top surface of the substrate 100 by the first spacer 131. The second spacer 132 may be formed of a different material from the first spacer 131. As an illustration, the first spacer 131 and the second spacer 132 may be a silicon nitride film and a silicon oxide film, respectively. The first and second spacers 131 and 132 may be formed by sequentially forming a silicon nitride film and a silicon oxide film covering the gate pattern, and then performing a dry etching using plasma having a strong directivity. The silicon nitride film and the silicon oxide film may be formed by a chemical vapor deposition (CVD) method.

Using the first and second spacers 131 and 132 as an ion implantation mask, a first impurity region 101 may be formed in the first active portion 105 and a second impurity region 102 may be formed in the second active portion 106. The first and second impurity regions 101 and 102 may be different conductivity types. As an illustration, in the case that the first transistor region 10 is an NMOS region, the first impurity region 101 is a region doped with an n-type impurity and in the case that the second transistor region 20 is an PMOS region, the second impurity region 102 is a region doped with an p-type impurity.

Figure 2:
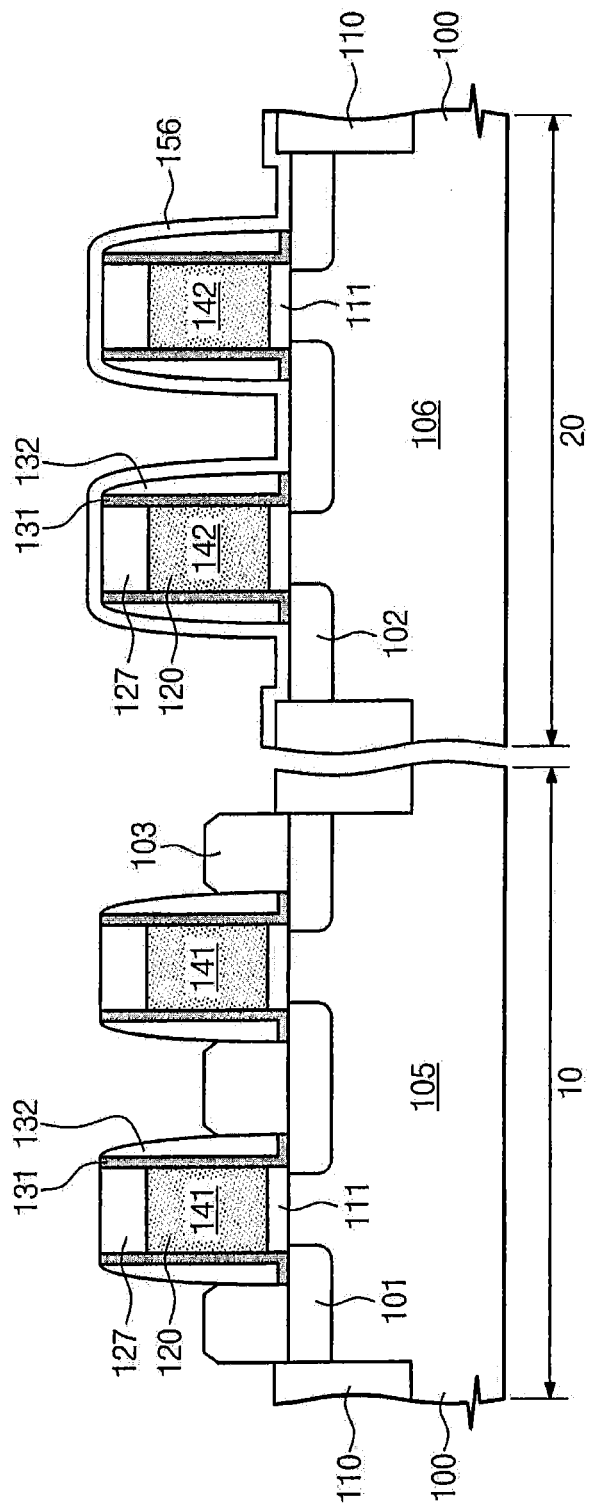

Referring to FIG. 2, after forming a first epitaxial prevention film 156 on an entire surface of the substrate 100, the first epitaxial prevention film 156 is patterned to expose the first transistor region 10. The first epitaxial prevention film 156 may include material having an etching selectivity with respect to the first and second spacers 131 and 132. As an illustration, the first epitaxial prevention film 156 may include at least one of a silicon nitride layer, a silicon oxynitride layer and a silicon oxide layer. A semiconductor extension layer 103 may be grown on a top surface of the first active portion 105 exposed by the first epitaxial prevention film 156. The semiconductor extension layer 103 may be formed by a selective epitaxial growth (SEG) process. The semiconductor extension layer 103 may be doped with the second conductivity type impurity by an in-situ method. Alternatively, the semiconductor extension layer 103 may be doped with the second conductivity type impurity by an ion implantation method after forming the semiconductor extension layer 103. The semiconductor extension layer 103 may constitute a portion of a source/drain region. After forming the semiconductor extension layer 103, the first epitaxial prevention film 156 may be removed. The semiconductor extension layer 103 may have the substantially same crystal structure as the substrate 100. The semiconductor extension layer 103 may reduce a short channel effect of a device.

Figure 3:
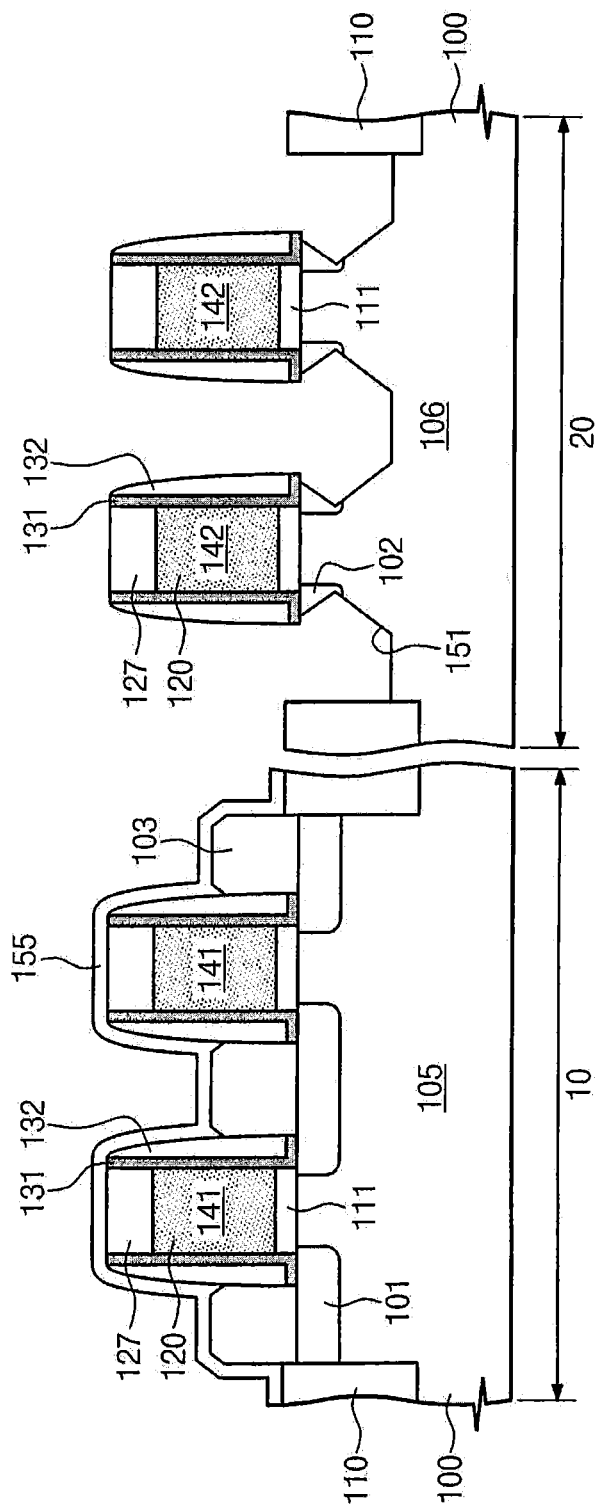

Referring to FIG. 3, after forming a second epitaxial prevention film 155 on an entire surface of the substrate 100, the second epitaxial prevention film 155 may be patterned to expose the second transistor region 20. The second epitaxial prevention film 155 may include the same material as the first epitaxial prevention film 156. A recess region 151 may be formed by etching the exposed second active portion 106. The recess region 151 may be formed by an anisotropic wet etching process. The anisotropic etching process may use crystal faces selected from the faces of the substrate 100 as an etching stop face. As an illustration, the anisotropic wet etching process may use {111} faces among the faces of the substrate 100 as an etching stop face. As a result, a vertical face of the recess region 151 may have a pointed shape toward a channel region under the second dummy gate structure 142. That is, an upper sidewall and a lower sidewall of the substrate 100 defining the recess region 151 obliquely cross each other toward a channel region under the second dummy gate structure 142. In the case that the substrate 100 is a silicon substrate, the anisotropic etching process may use an anisotropic etching solution including ammonia and/or tetramethyl ammonium hydroxide. A portion of the second impurity region 102 may be removed due to a formation of the recess region 151.

Alternatively, the recess region 151 may be formed by an anisotropic dry etching process using an etching gas having the directivity in a specific direction. As an illustration, the anisotropic dry etching process may include a process etching with an etching gas having the directivity in a direction making an acute angle with a direction perpendicular to a top surface of the substrate 100. In this case, the device isolation pattern 110 and the spacer structures 131 and 132 may be used as an etching mask. The recess region formed by the dry etching process may be different from the recess region 151 illustrated in FIG. 3. As an illustration, the recess region formed by the dry etching process may not have a sidewall having a pointed shape like the sidewall of the recess region 151.

Figure 4:
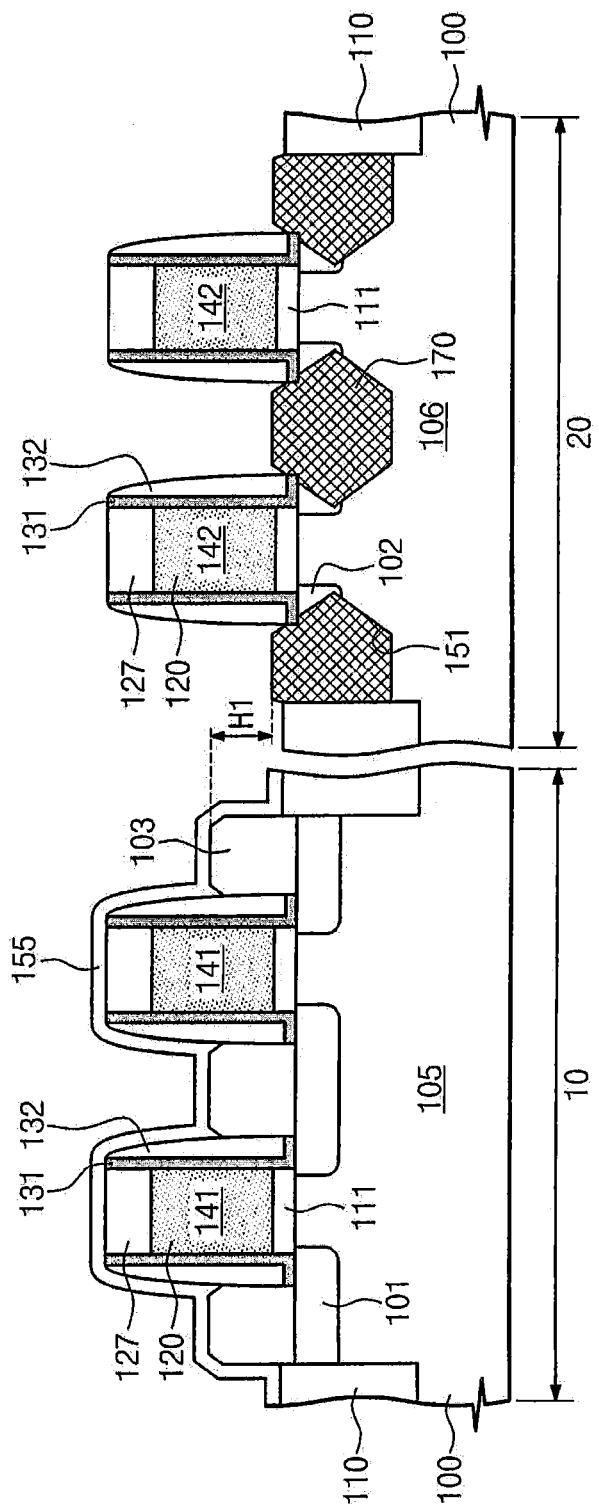

Referring to FIG. 4, a compression stress pattern 170 filling the recess region 151 may be formed. The compression stress pattern 170 may be formed by performing a selective epitaxial growth process on the recess region 151. Since the first transistor region 10 is covered with the second epitaxial prevention film 155, the compression stress pattern 170 may not be formed on the first active portion 105. In the case that the substrate 100 is formed from silicon, the compression stress pattern 170 may be formed from silicon-germanium. The compression stress pattern 170 may be a crystal state. As an illustration, the compression stress pattern 170 may be substantially a single crystal.

The compression stress pattern 170 may be doped with the first conductivity type impurity by an in-situ method. Alternatively, the compression stress pattern 170 may be doped with the first conductivity type impurity by an ion implantation method after forming the compression stress pattern 170. After forming the compression stress pattern 170, the second epitaxial prevention film 155 may be removed. The compression stress pattern 170 may increase mobility of a carrier in the second transistor region 20.

The compression stress pattern 170 may be grown to be higher than a top surface of the substrate 100. A top surface of the compression stress pattern 170 may be higher than a top surface of the substrate 100. Thus, a portion of the sidewall of the compression stress pattern 170 upwardly protrudes from the substrate 100. The portion of the sidewall of the compression stress pattern 170 upwardly protruding from the substrate 100 may extend in parallel to a sidewall of the substrate 100 defining the recess region 151. Thus, as illustrated, the compression stress pattern 170 may have a hexagonal shape between the second dummy gate structures 142. This is because the compression stress pattern 170 maintains a direction of the crystal structure while growing from a lower portion to an upper portion. Alternatively, one sidewall of the compression stress pattern 170 adjacent to the device isolation pattern 110 may be formed in parallel to a sidewall of the device isolation pattern 110.

A top surface of the semiconductor extension layer 103 may be higher than a top surface of the compression stress pattern 170. That is, the top surface of the semiconductor extension layer 103 may be located to be higher than the top surface of the compression stress pattern 170 by H1. As an integration of a semiconductor device increases, an area of a transistor becomes gradually small. As an area of a MOS field effect transistor becomes gradually small, a short channel effect occurring between a source and a drain due to punch-through phenomenon may deteriorate a device characteristic like a switching function and power consumption. As the integration level of semiconductor device increases, a height of the semiconductor extension layer 103 may also gradually increase.

Figure 5:
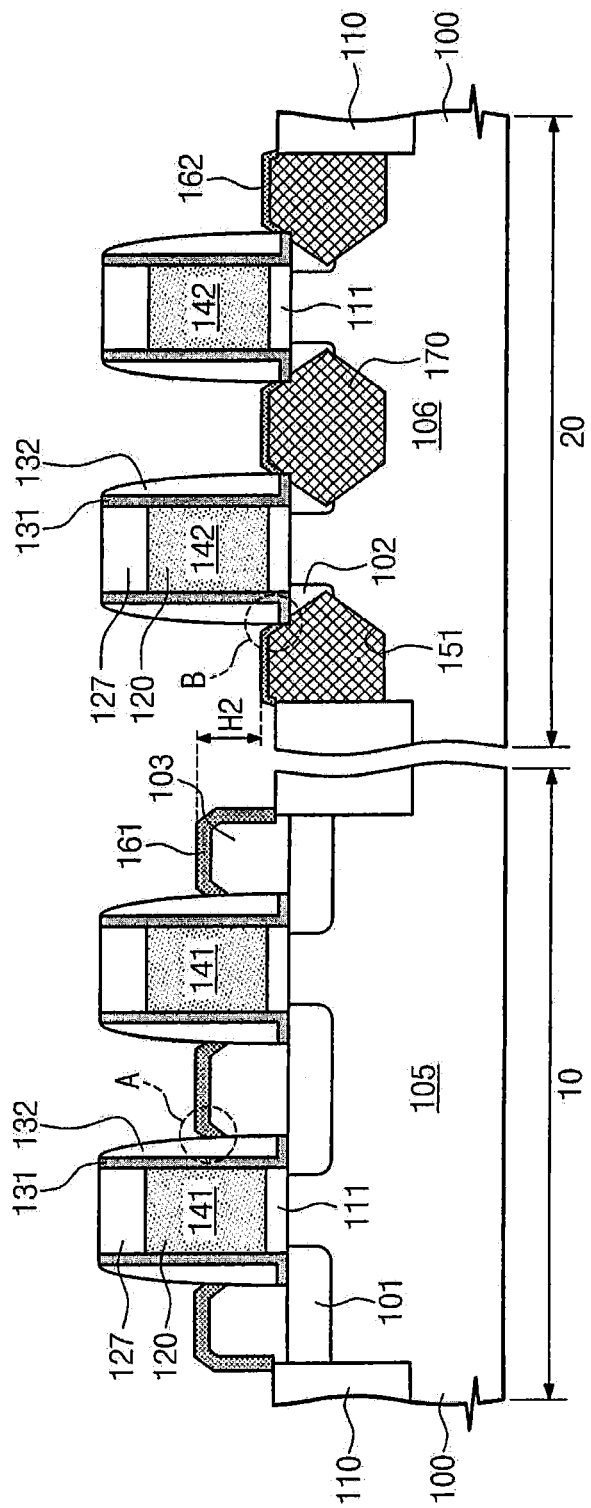
Figure 6:
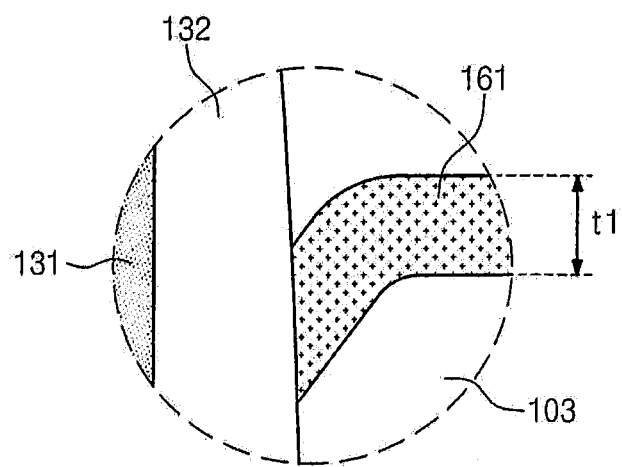
Figure 7:
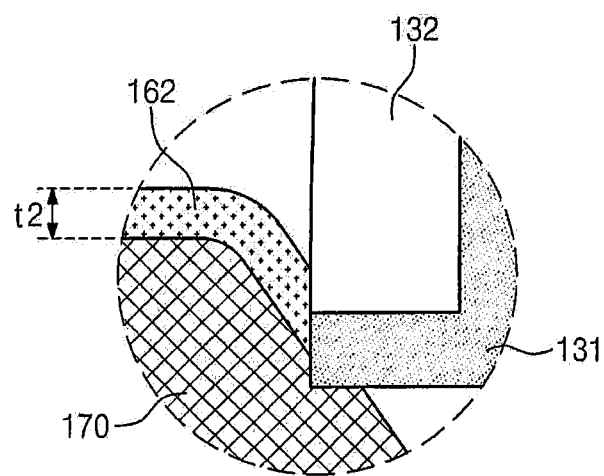

Referring to FIGS. 5 through 7, a first etching stop film 161 and a second etching stop film 162 may be formed on the first and second transistor regions 10 and 20 respectively. FIG. 6 is an enlarged view of "A" region illustrated in FIG. 5 and FIG. 7 is an enlarged view of "B" region illustrated in FIG. 5. The first etching stop film 161 may be formed on the semiconductor extension layer 103 and the second etching stop film 162 may be formed on the compression stress pattern 170. The first and second etching stop films 161 and 162 may be formed at the same time. The thickness (t1) of the first etching stop film 161 may be formed to be greater than the thickness (t2) of the second etching stop film 162.

Forming the first and second etching stop films 161 and 162 may include diffusing at least one (hereinafter it is referred to as "reaction atom") of nitrogen atoms and carbon atoms into exposed surfaces of the semiconductor extension layer 103 and the compression stress pattern 170. That is, at least one of the reaction atoms may diffuse into the exposed surface of the semiconductor extension layer 103 and the compression stress pattern 170 to combine with atoms constituting the semiconductor extension layer 103 and the compression stress pattern 170. As an illustration, in the case that the semiconductor extension layer 103 is a silicon layer and the compression stress pattern 170 is a silicon-germanium layer, the reaction atoms combine with silicon atoms of upper portions of the semiconductor extension layer 103 and the compression stress pattern 170 to form a silicon nitride film and/or a silicon carbide film. The first and second etching stop films 161 and 162 may be formed while the exposed upper portions of the semiconductor extension layer 103 and the compression stress pattern 170 react to the reaction atoms. In the case that the compression stress pattern 170 is silicon-germanium, silicon atoms in the compression stress pattern 170 may have higher reactivity than germanium atoms. Therefore, silicon atoms in the compression stress pattern 170 substantially react to the reaction atoms or a few of germanium atoms may react to the reaction atoms. A silicon concentration of the compression stress pattern 170 is lower than a silicon concentration of the semiconductor extension layer 103. Thus, a thickness of the second etching stop film 162 may be smaller than a thickness of the first etching stop film 161. As an illustration, the thickness of the second etching stop film 162 may be greater than the thickness of the first etching stop film 161 by about 30%-60%. The difference of thickness between the first and second etching stop films 161 and 162 may ease a formation of contact hole when forming a contact plug described further below. A top surface of the first etching stop film 161 may be located to be higher than a top surface of the second etching stop film 162 by a H2. The H2 may be greater than the H1 described in FIG. 4.

Each of the first and second etching stop films 161 and 162 may be selectively formed on the semiconductor extension layer 103 and the compression stress pattern 170. That is, the reaction atoms may selectively react to silicon atoms in the semiconductor extension layer 103 and the compression stress pattern 170. Thus, the first and second etching stop films 161 and 162 may be not formed on the spacer pattern 131 and 132. That is, the first and second etching stop films 161 and 162 may expose the spacer pattern 131 and 132.

In the case that the first spacer 131 is an insulating film formed by a chemical vapor deposition, the density of the first and second etching stop films 161 and 162 may be greater than the density of the first spacer 131. This is because the first and second etching stop films 161 and 162 are formed from the semiconductor extension layer 103 and the compression stress pattern 170 which are epitaxial layers. Thus, the first and second etching stop films 161 and 162 may provide a sufficient etching resistance even though they are formed to be thinner than when they are formed by a chemical vapor deposition (CVD) process.

A process of forming the first and second etching stop films 161 and 162 may be performed by providing a predetermined source gas to the substrate 100. As an illustration, the source gas may include nitrogen ($N_2$) gas and argon (Ar) gas. The nitrogen ($N_2$) gas may be provided in a plasma state. The process of forming the first and second etching stop films 161 and 162 may be performed at a temperature of about 300° C.~600° C. The quantity of nitrogen gas being provided to a process chamber may be 10 $cm^3$/min~300 $cm^3$/min.

Figure 8:
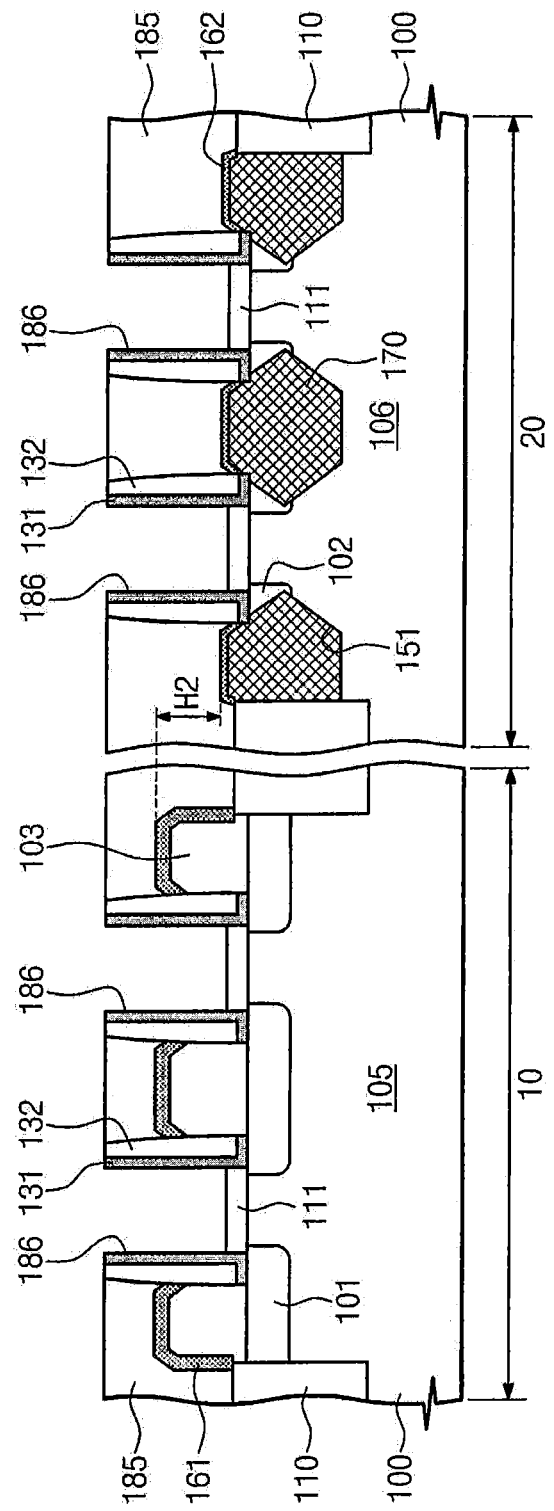

Referring to FIG. 8, the dummy gate electrode 120 and the dummy hard mask pattern 127 may be removed. Removal of the dummy gate electrode 120 and the dummy hard mask pattern 127 may be performed using a process of exposing the dummy hard mask pattern 127 by a planarization process after forming a first interlayer insulating film 185 covering the substrate 100. The first interlayer insulating film 185 may include at least one of a silicon oxide film, a silicon nitride film and a silicon oxynitride film. The first interlayer insulating film 185 may include material having an etching selectivity with respect to the dummy hard mask pattern 127. As an illustration, in the case that the dummy hard mask pattern 127 is a silicon nitride film, the first interlayer insulating film 185 may be a silicon oxide film. The first interlayer insulating film 185 may be formed by a chemical vapor deposition (CVD) process. The exposed dummy hard mask pattern 127 and the dummy gate electrode under the exposed dummy hard mask pattern 127 may be selectively removed to form an opening 186. The opening 186 may be a region defined by the first spacer 131 and the gate insulating pattern 111.

Figure 9:
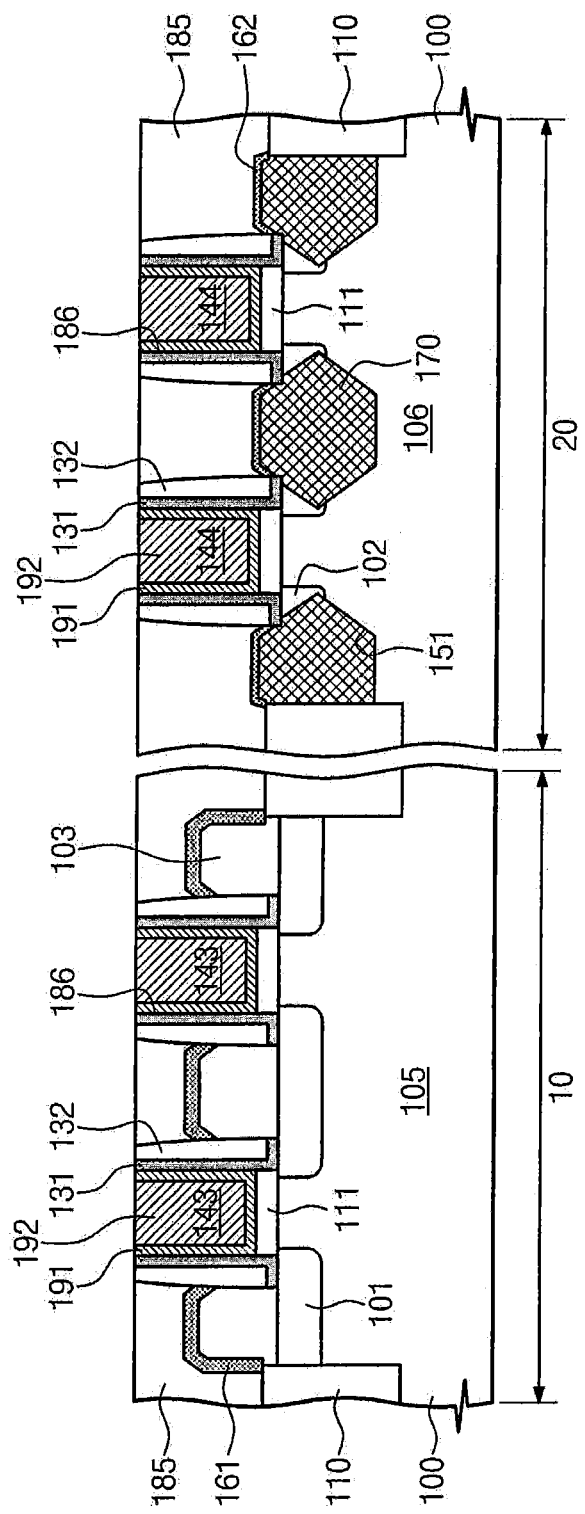

Referring to FIG. 9, a barrier pattern 191 and a gate electrode 192 may be formed in the opening 186. A first gate structure 143 and a second gate structure 144 may be formed by forming the barrier pattern 191 and the gate electrode 192. The barrier pattern 191 and the gate electrode 192 may be formed by sequentially forming a barrier film and a gate electrode film on a resultant structure in which the opening 186 is formed, and then planarizing the barrier film and the gate electrode film down to a top surface of the first interlayer insulating film 185. The barrier film may include a diffusion barrier film. As an illustration, the diffusion barrier film may be formed from a conductive metal nitride film. The diffusion barrier film may be one of a titanium nitride film, a tantalum nitride film and a tungsten nitride film. The gate electrode film may be a metal film. As an illustration, the gate electrode film may be aluminum or copper.

Figure 10:
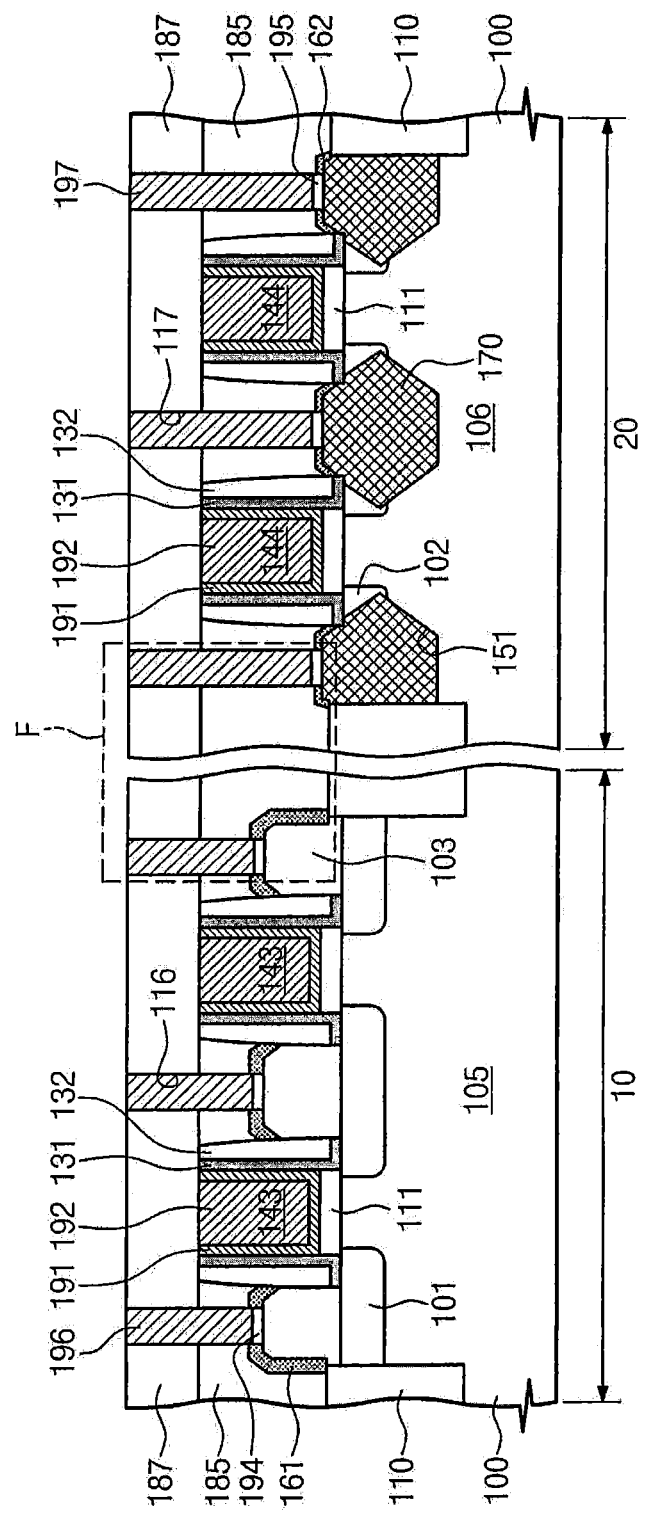
Figure 11:
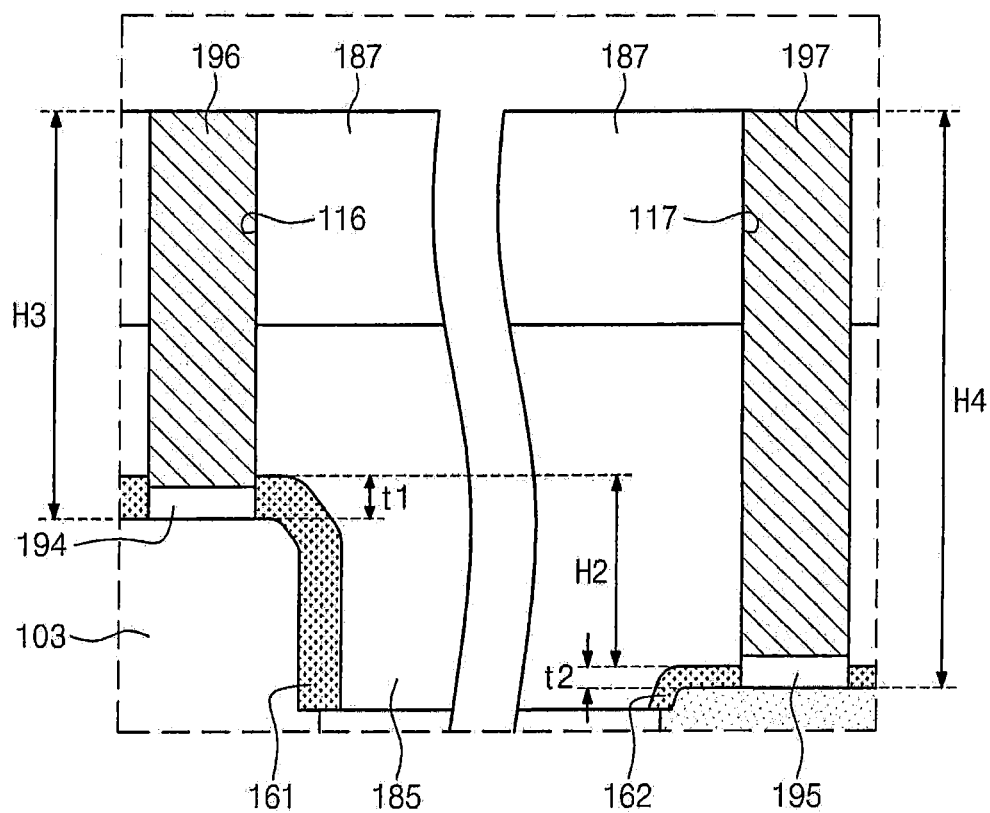

Referring to FIGS. 10 and 11, a second interlayer insulating film 187 may be formed on a resultant structure in which the barrier pattern 191 and the gate electrode 192 are formed. FIG. 11 is an enlarged view of "F'" region illustrated in FIG. 10. The second interlayer insulating film 187 may be formed from the same material as the first interlayer insulating film 185. First and second contact holes 116 and 117 penetrating the first and second interlayer insulating films 185 and 187 may be formed. The first and second contact holes 116 and 117 may expose top surfaces of the semiconductor extension layer 103 and the compression stress pattern 170 respectively. The first and second contact holes 116 and 117 may be formed by a dry etching process. A first contact plug 196 and a second contact plug 197 may be formed on the semiconductor extension layer 103 and the compression stress pattern 170 respectively exposed by the first and second contact holes 116 and 117. The first contact plug 196 may be electrically connected to the semiconductor extension layer 103 and the second contact plug 197 may be electrically connected to the compression stress pattern 170. A first metal-semiconductor compound 194 may be formed between the first contact plug 196 and the semiconductor extension layer 103. A second metal-semiconductor compound 195 may be formed between the second contact plug 197 and the compression stress pattern 170. In the case that the semiconductor extension layer 103 is a silicon layer, the first metal-semiconductor compound 194 may be metal silicide. In the case that the compression stress pattern 170 is formed from silicon-germanium, the second metal-semiconductor compound 195 may be metal-silicon-germanium compound.

The first contact plug 196 and the second contact plug 197 may be formed at the same time. As an illustration, the first and second contact plugs 196 and 197 may be formed by forming conductive material filling the first and second contact holes 116 and 117, and then planarizing the conductive material down to a top surface of the second interlayer insulating film 187.

As appreciated by the present inventive entity, a problem may occur that a void is formed and a space between gates is incompletely filled when filling an interlayer insulating film between the gates. In some embodiments of the inventive concept, the first and second etching stop films 161 and 162 may not be formed on sidewalls of the first and second spacers 131 and 132. Therefore, a distance between gates increases and thereby an interlayer insulating film may be easily formed between gates.

As described above, in for example FIG. 11, the top surface of the first etching stop film 161 may be formed to be higher than the top surface of the second etching stop film 162 by 112. Therefore, a depth H4 of the second contact hole 117 may be greater than a depth H3 of the first contact hole 116. A thickness (t1) of the first etching stop film 161 is greater than a thickness (t2) of the second etching stop film 162. Thus, the first etching stop film 161 may prevent the semiconductor extension layer 103 from being damaged by an over-etching while the second contact hole 117 is formed.

Figure 12:
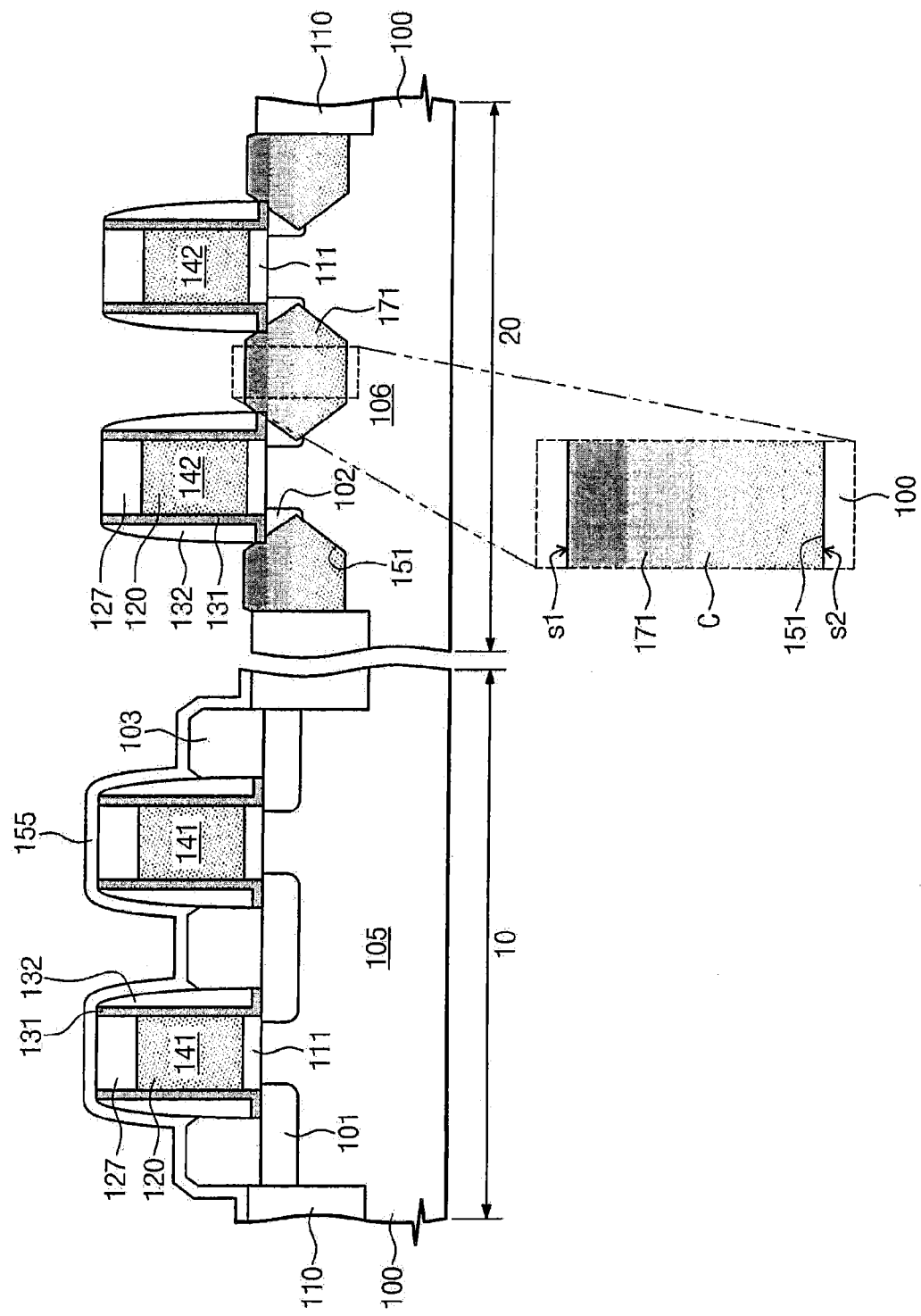
FIGS. 12 through 14 are cross sectional views for explaining semiconductor devices and methods of manufacturing semiconductor devices in accordance with embodiments of the inventive concept.
Figure 13:
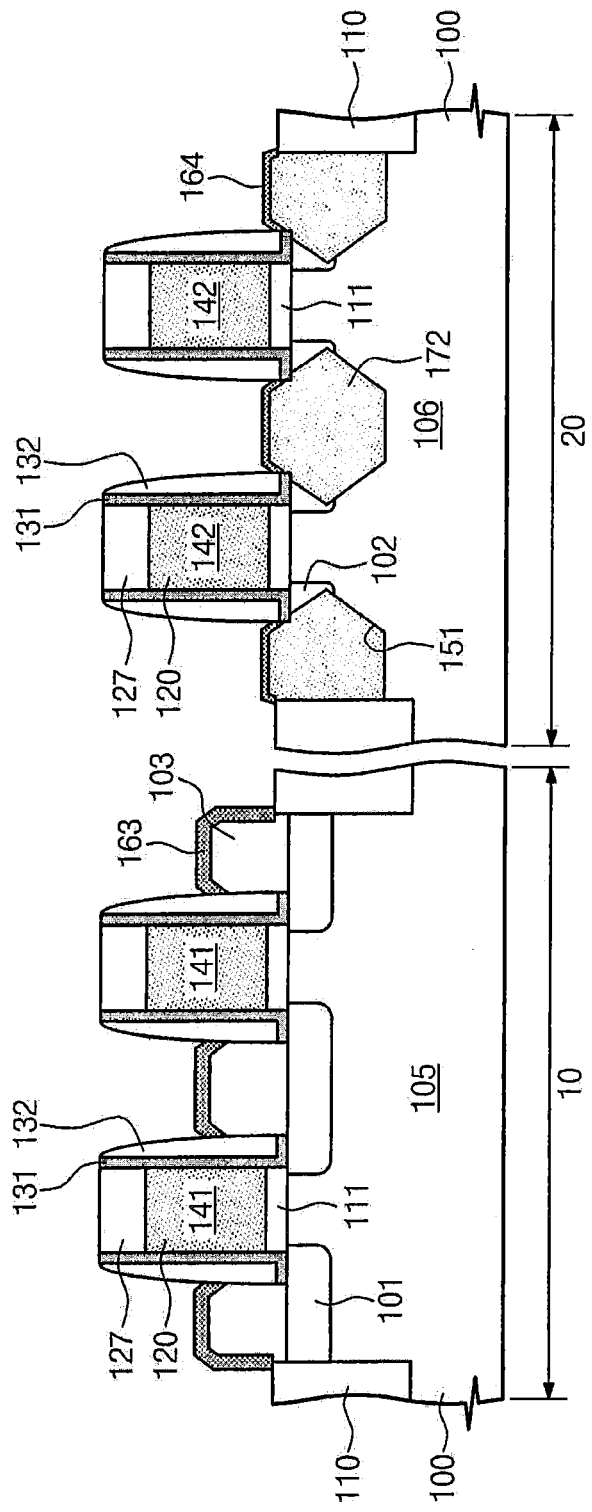
Figure 14:
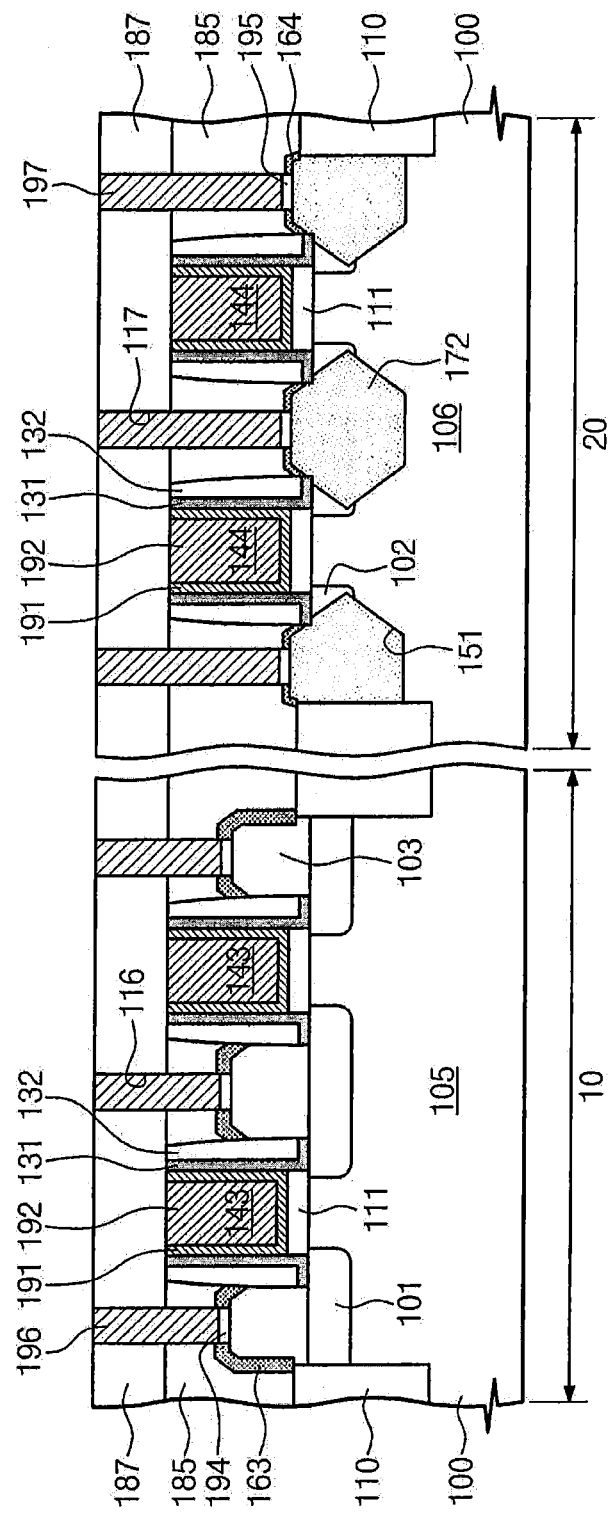

Referring to FIGS. 12 through 14, a second embodiment of the inventive concept will be described.

Referring to FIG. 12, a preliminary compression stress pattern 171 may be formed on a resultant structure in which the recess region 151 is formed. The preliminary compression stress pattern 171 may be a silicon-germanium layer. A shading concentration illustrated in an enlarged "C" region may represent a silicon concentration of the preliminary compression stress pattern 171. A silicon concentration of a portion adjacent to a top surface (s1) of the preliminary compression stress pattern 171 may be higher than a silicon concentration of a portion adjacent to a bottom surface (s2) of the preliminary compression stress pattern 171. That is, a silicon concentration of the preliminary compression stress pattern 171 may increase as approaching from a lower portion to an upper portion. As an illustration, a profile of the silicon concentration may be provided by sequentially forming a plurality of silicon-germanium layers having different silicon concentrations in the recess region 151. Alternatively, a profile of the silicon concentration may increase as approaching from a lower portion to an upper portion of the preliminary compression stress pattern 171.

Referring to FIG. 13, a first etching stop film 163 and a second etching stop film 164 may be formed on the first transistor region 10 and the second transistor region 20 respectively. The first etching stop film 163 may be formed on the semiconductor extension layer 103 and the second etching stop film 164 may be formed on the preliminary compression stress pattern 171. The first and second etching stop films 163 and 164 may include at least one of a silicon nitride film and a silicon carbon film. The first and second etching stop films 163 and 164 may be formed at the same time. A thickness of the first etching stop film 163 may be formed to be greater than a thickness of the second etching stop film 164.

Forming the first and second etching stop films 163 and 164 may include diffusing at least one (hereinafter it is referred to as "reaction atom") of nitrogen atoms and carbon atoms into exposed surfaces of the semiconductor extension layer 103 and the preliminary compression stress pattern 171. That is, at least one of the reaction atoms may diffuse into the exposed surface of the semiconductor extension layer 103 and the preliminary compression stress pattern 171 to combine with atoms constituting the semiconductor extension layer 103 and the preliminary compression stress pattern 171. As an illustration, in the case that the semiconductor extension layer 103 is a silicon layer and the preliminary compression stress pattern 171 is a silicon-germanium layer, the reaction atoms combine with silicon atoms of upper portions of the semiconductor extension layer 103 and the preliminary compression stress pattern 171 to form a silicon nitride film and/or a silicon carbide film.

In the case that the preliminary compression stress pattern 171 is silicon-germanium, silicon atoms in the preliminary compression stress pattern 171 may have higher reactivity than germanium atoms. Therefore, silicon atoms in the preliminary compression stress pattern 171 substantially react to the reaction atoms or a few of germanium atoms may react to the reaction atoms. A silicon concentration of the preliminary compression stress pattern 171 is lower than a silicon concentration of the semiconductor extension layer 103. Thus, a thickness of the second etching stop film 164 may be less than a thickness of the first etching stop film 163. As an illustration, the thickness of the first etching stop film 163 may be greater than the thickness of the second etching stop film 164 by about 30%~60%.

A silicon concentration of the preliminary compression stress pattern 171 may be changed to form a compression stress pattern 172. As described above, germanium atoms in a region adjacent to an upper portion of the preliminary compression stress pattern 171, that is, the second etching stop film 164 may not react when forming the second etching stop film 164. That is, as the second etching stop film 164 is formed, a germanium concentration of an upper portion of the preliminary compression stress pattern 171 may become high. According to the second embodiment of the inventive concept, it may be prevented that germanium atoms are concentrated in an upper portion of the compression stress pattern by making a silicon concentration of lower portion of the preliminary compression stress pattern 171 higher than a silicon concentration of upper portion of the preliminary compression stress pattern 171. After the second etching stop film 164 is formed, a germanium concentration of upper portion of the preliminary compression stress pattern 171 may substantially become the same as a germanium concentration of lower portion of the compression stress pattern 172.

Referring to FIG. 14, a barrier pattern 191 and a gate electrode 192 may be formed. First and second gate structures 143 and 144 may be formed by forming the barrier pattern 191 and the gate electrode 192. A formation of the barrier pattern 191 and the gate electrode 192 may include by sequentially forming a barrier film and a gate electrode film after removing the dummy gate electrode 120 and the dummy hard mask pattern 127. The barrier pattern 191 and the gate electrode 192 may be formed by planarizing the barrier film and the gate electrode film down to a top surface of the first interlayer insulating film 185. The barrier film may include a diffusion barrier film. As an illustration, the diffusion barrier film may be formed from a conductive metal nitride film. The diffusion barrier film may be one of a titanium nitride film, a tantalum nitride film and a tungsten nitride film. The gate electrode film may be a metal film. As an illustration, the gate electrode film may be aluminum or copper.

A second interlayer insulating film 187 may be formed on a resultant structure in which the barrier pattern 191 and the gate electrode 192 are formed. The second interlayer insulating film 187 may be formed from the same material as the first interlayer insulating film 185. First and second contact holes 116 and 117 penetrating the first and second interlayer insulating films 185 and 187 respectively may be formed. The first and second contact holes 116 and 117 may expose top surfaces of the semiconductor extension layer 103 and the preliminary compression stress pattern 172 respectively. The first and second contact holes 116 and 117 may be formed by a dry etching process. A first contact plug 196 and a second contact plug 197 may be formed on the semiconductor extension layer 103 and the preliminary compression stress pattern 172 respectively exposed by the first and second contact holes 116 and 117. The first contact plug 196 may be electrically connected to the semiconductor extension layer 103 and the second contact plug 197 may be electrically connected to the preliminary compression stress pattern 172. A first metal-semiconductor compound 194 may be formed between the first contact plug 196 and the semiconductor extension layer 103. A second metal-semiconductor compound 195 may be formed between the second contact plug 197 and the preliminary compression stress pattern 172. In the case that the semiconductor extension layer 103 is a silicon layer, the first metal-semiconductor compound 194 may be metal silicide. In the case that the preliminary compression stress pattern 172 is formed from silicon-germanium, the second metal-semiconductor compound 195 may be metal-silicon-germanium compound.

The first contact plug 196 and the second contact plug 197 may be formed at the same time. As an illustration, the first and second contact plugs 196 and 197 may be formed by forming conductive material (not illustrated) filling the first and second contact holes 116 and 117, and then planarizing the conductive material down to a top surface of the second interlayer insulating film 187.

According to the second embodiment of the inventive concept, the first and second etching stop films 163 and 164 may not be formed on sidewalls of the first and second spacer patterns 131 and 132. Therefore, a size of space between gates increases and thereby an interlayer insulating film may be easily formed between gates. According to the second embodiment of the inventive concept, an electrical characteristic of semiconductor device may be improved by preventing germanium atoms from being concentrated in the compression stress pattern.

Referring to FIGS. 15 through 20, embodiments of the inventive concept are described.

Figure 15:
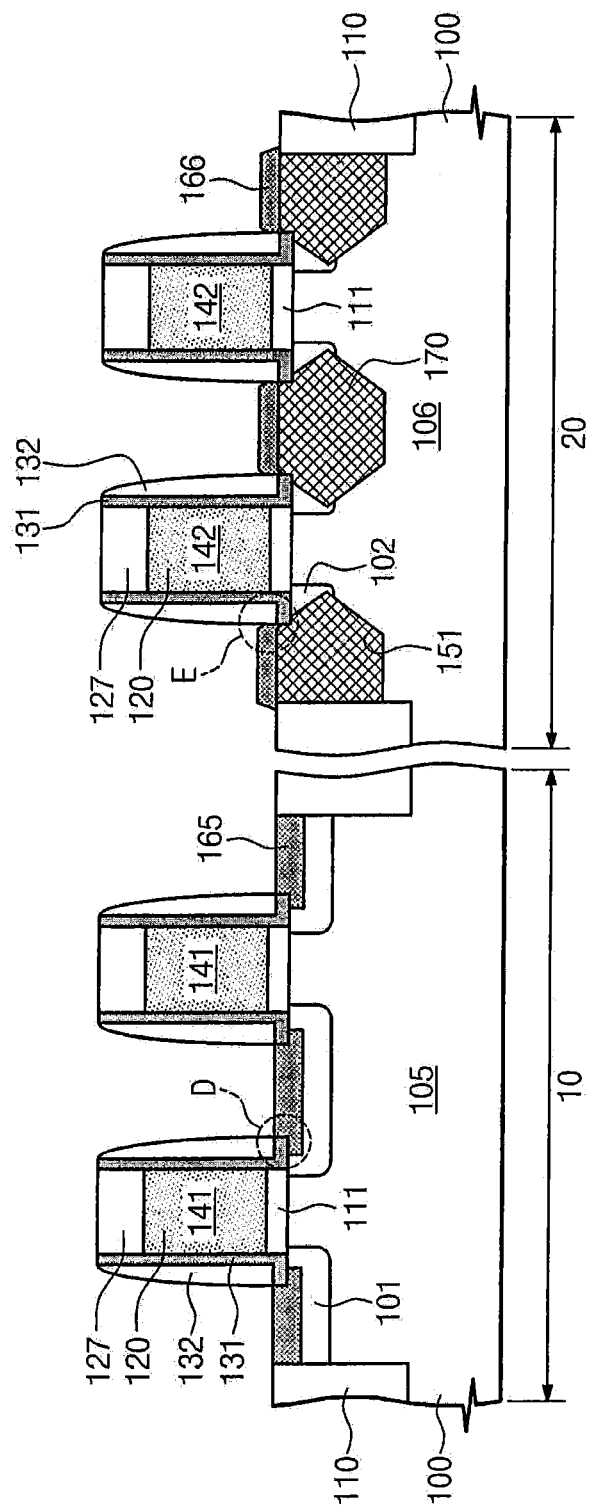
FIGS. 15 through 20 are cross sectional views for explaining semiconductor devices and methods of manufacturing semiconductor devices in accordance with embodiments of the inventive concept.
Figure 16:
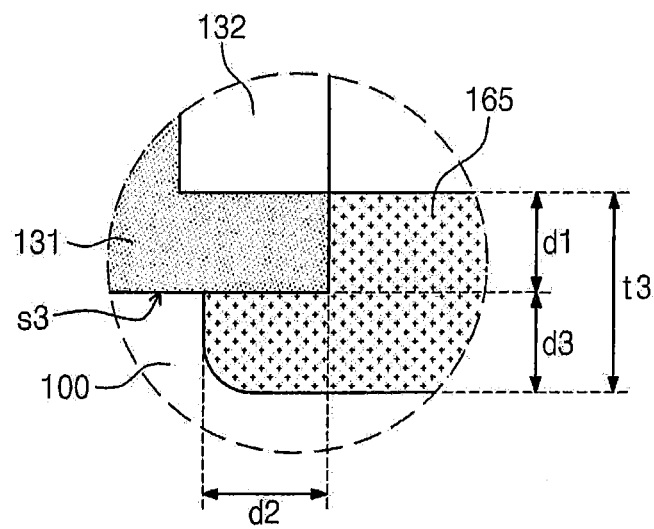
Figure 17:
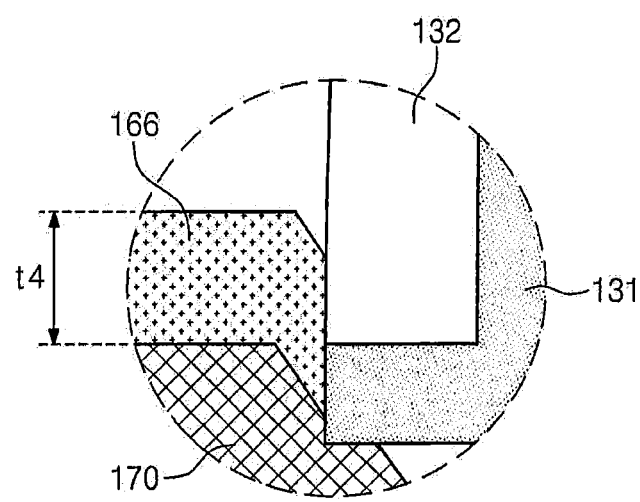

Referring to FIGS. 15 through 17, a first etching stop film 165 and a second etching stop film 166 may be formed on a resultant structure described with reference to FIG. 1. FIG. 16 is an enlarged view of "D" region of FIG. 15 and FIG. 17 is an enlarged view of "E" region of FIG. 15. The first and second etching stop films 161 and 162 may be formed at the same time. The first etching stop film 165 may be formed on the substrate 100 exposed by the first dummy gate structure 141. A top surface of the first etching stop film 165 is upwardly spaced d1 apart from a top surface (s3) of the substrate 100 and a bottom surface of the first etching stop film 165 is downwardly spaced d3 apart from a top surface (s3) of the substrate 100. That is, the top surface (s3) of the substrate 100 is provided between the top and bottom surfaces of the first etching stop film 165. This is because a portion of the substrate 100 reacts to reaction atoms to form the first etching stop film 165. The second etching stop film 166 is formed on the compression stress pattern 170.

Forming the first and second etching stop films 165 and 166 may include diffusing at least one (hereinafter it is referred to as "reaction atom") of nitrogen atoms and carbon atoms into exposed surfaces of the substrate 100 and the compression stress pattern 170. That is, at least one of the reaction atoms may diffuse into the exposed surface of the substrate 100 and the compression stress pattern 170 to combine with atoms constituting the substrate 100 and the compression stress pattern 170. As an illustration, in the case that the substrate 100 is a silicon layer and the compression stress pattern 170 is a silicon-germanium layer, the reaction atoms combine with silicon atoms of upper portions of the substrate 100 and the compression stress pattern 170 to form a silicon nitride film and/or a silicon carbide film. That is, exposed upper portions of the substrate 100 and the compression stress pattern 170 react to reaction atoms to form the first etching stop film 165.

In the case that the compression stress pattern 170 is silicon-germanium, silicon atoms in the compression stress pattern 170 may have higher reactivity than germanium atoms. Therefore, silicon atoms in the compression stress pattern 170 substantially react to the reaction atoms or a few of germanium atoms may react to the reaction atoms. A silicon concentration of the compression stress pattern 170 is lower than a silicon concentration of the substrate 100. Thus, a thickness (t4) of the second etching stop film 166 may be smaller than a thickness (t3) of the first etching stop film 165. As an illustration, the thickness of the first etching stop film 165 may be greater than the thickness of the second etching stop film 166 by about 30%~60%.

The first and second etching stop films 165 and 166 may be selectively formed on the compression stress pattern 170 and the substrate 100. That is, the reaction atoms selectively react to silicon atoms in the compression stress pattern 170 and the substrate 100. Thus, the first and second etching stop films 165 and 166 may not be formed on the spacer patterns 131 and 132. That is, the first and second etching stop films 165 and 166 may expose the spacer patterns 131 and 132.

A portion of the first etching stop film 165 may extend under the spacer patterns 131 and 132 by a predetermined distance (d2). As an illustration, in the case of forming the first etching stop film 165 to be thicker than the first etching stop film described in the first embodiment, reaction atoms pass through the substrate 100 under the spacer patterns 131 and 132 and thereby the first etching stop film 165 may extend under the spacer patterns 131 and 132.

Figure 18:
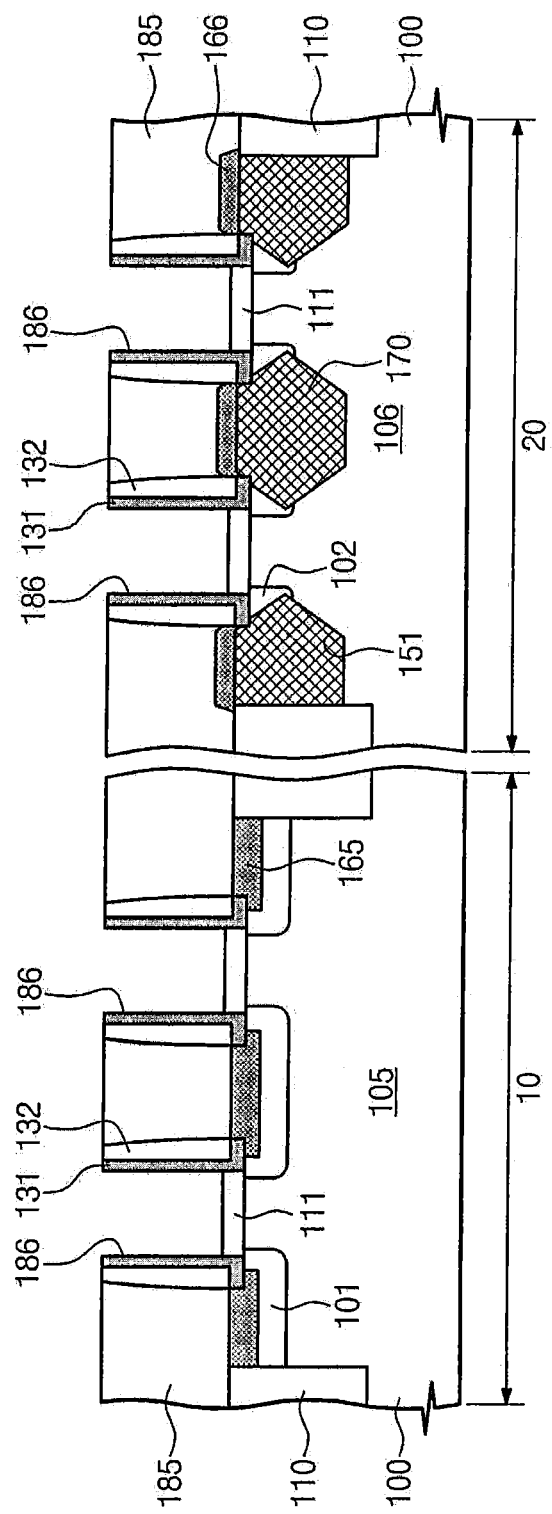

Referring to FIG. 18, the dummy gate electrode 120 and the dummy hard mask pattern 127 may be removed. A removal of the dummy gate electrode 120 and the dummy hard mask pattern 127 may include a process of forming a first interlayer insulating film 185 covering the substrate 100, and then exposing the dummy hard mask pattern 127 by a planarization process. The first interlayer insulating film 185 may include at least one of a silicon oxide layer, a silicon nitride layer and a silicon oxynitride layer. As an illustration, the first interlayer insulating film 185 may be formed by a chemical vapor deposition (CVD) process. The exposed dummy hard mask pattern 127 and the dummy gate electrode 120 under the exposed dummy hard mask pattern 127 are removed to form an opening 186. The opening 186 may be a region defined by the first spacer 131 and the gate insulating pattern 111.

Figure 19:
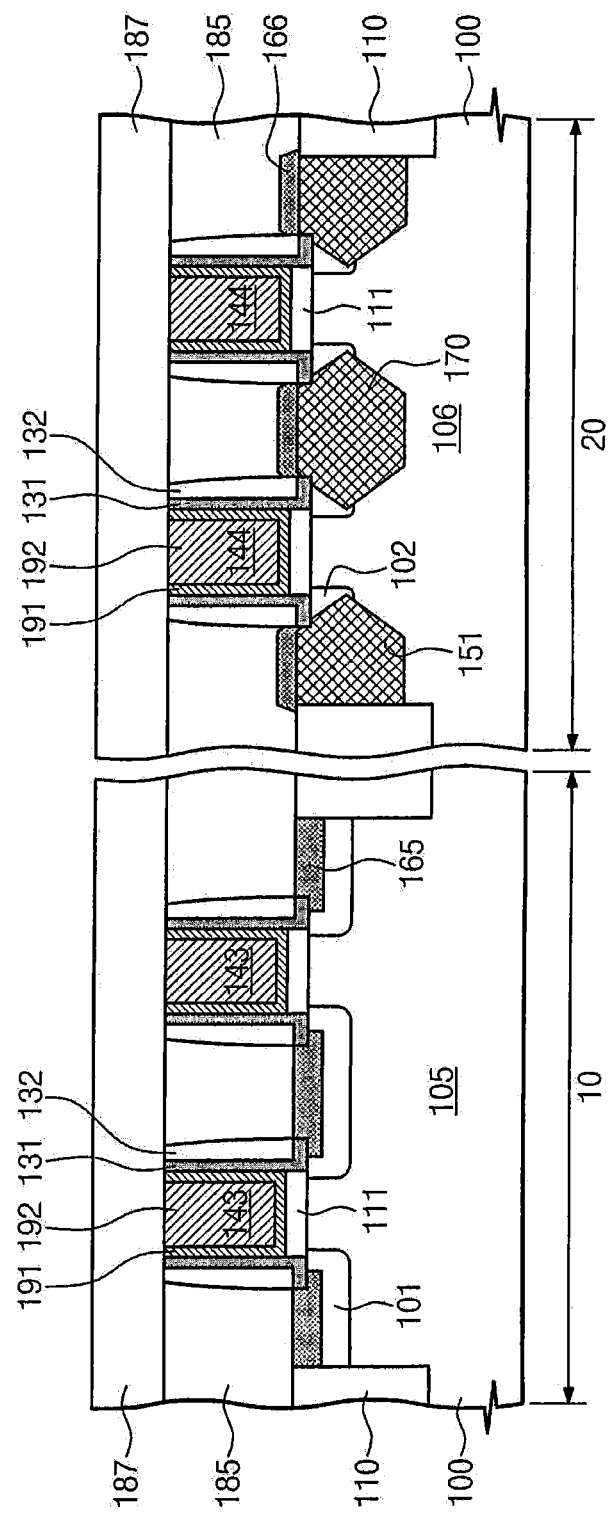

Referring to FIG. 19, a barrier pattern 191 and a gate electrode 192 may be formed in the opening 186. First and second gate structures 143 and 144 may be formed by forming the barrier pattern 191 and the gate electrode 192. The barrier pattern 191 and the gate electrode 192 may be formed by sequentially forming a barrier film and a gate electrode film on a resultant structure in which the opening 186 is formed, and then planarizing the barrier film and the gate electrode film down to a top surface of the first interlayer insulating film 185. The barrier film may include a diffusion barrier film. As an illustration, the diffusion barrier film may be formed from a conductive metal nitride film. The diffusion barrier film may include at least one of a titanium nitride film, a tantalum nitride film and a tungsten nitride film. The gate electrode film may be a metal film. The gate electrode film may be aluminum or copper. A second interlayer insulating film 187 may be formed on the resultant structure in which the barrier pattern 191 and the gate electrode 192 are formed.

Figure 20:
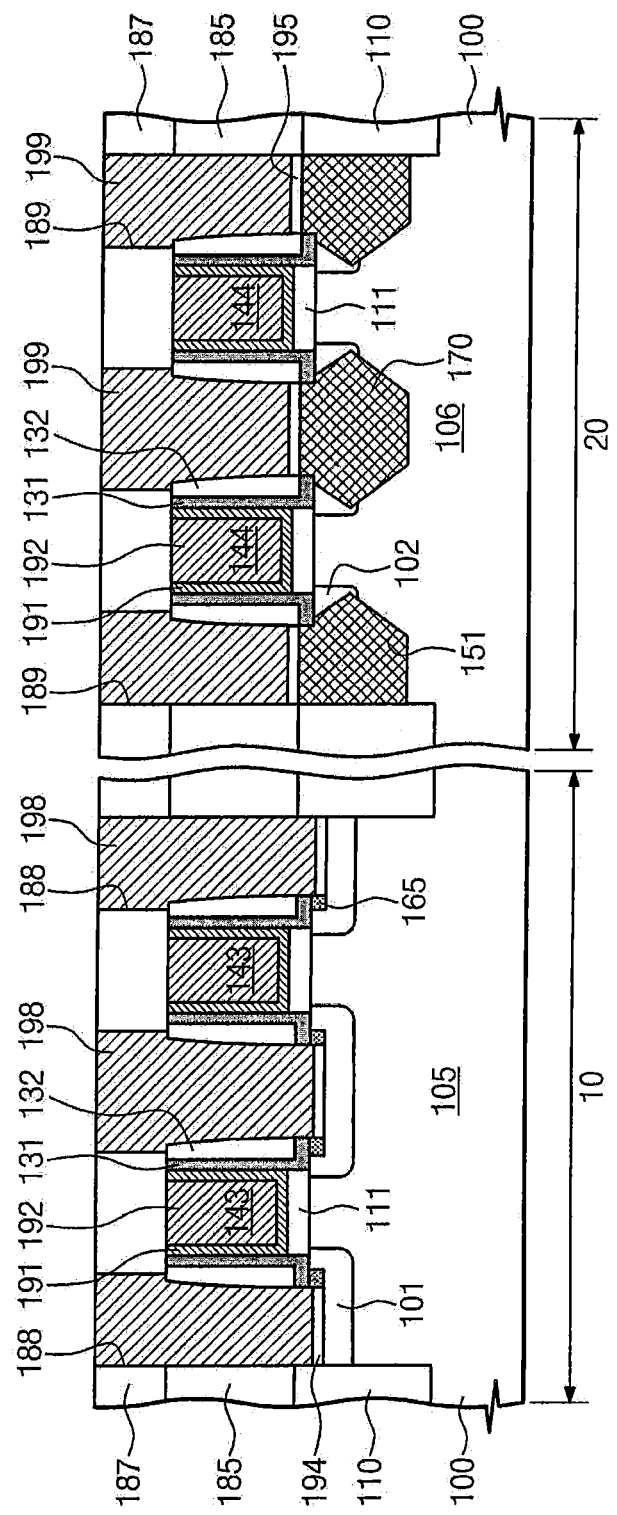

Referring to FIG. 20, third and fourth contact holes 188 and 189 penetrating the first and second interlayer insulating films 185 and 187. The third and fourth contact holes 188 and 189 may expose a sidewall of the second spacer 132. The second spacer 132 may be formed from material having an etching selectivity with respect to the first and second interlayer insulating films 185 and 187. As an illustration, the second spacer 132 may be a silicon nitride film or a silicon oxide film and the first and second interlayer insulating films 185 and 187 may be a silicon oxide film. Before performing the selective etching process, a protection layer may be further formed on upper portions of the gate structures 143 and 144. The protection layer may be formed from material having an etching selectivity with respect to the first and second interlayer insulating films 185 and 187. A third contact plug 198 and a fourth contact plug 199 may be formed in the third and fourth contact holes 188 and 189 respectively. The third and fourth contact holes 188 and 189 may be formed to be self aligned with the gate structures 143 and 144. After the third and fourth contact plugs 198 and 199 are formed, a portion of the first etching stop film 165 may remain under the first and second spacer patterns 131 and 132. As described above, in the case of forming the third and fourth contact plugs 198 and 199 by a self-aligned method, the third and fourth contact plugs 198 and 199 may be widened more. Thus, the third contact plug 198 may be electrically and stably connected to the substrate 100 and the fourth contact 199 may be electrically and stably connected to the compression stress pattern 170. The portion of the first etching stop film 165 remaining after the third and fourth contact plugs 198 and 199 are formed may reduce a leakage current.

A first metal-semiconductor compound layer 194 may be formed between the third contact plug 198 and the substrate 100. A second metal-semiconductor compound layer 195 may be formed between the fourth contact 199 and the compression stress pattern 170. In the case that the substrate 100 is a silicon layer, the first metal-semiconductor compound layer 194 may be metal silicide. In the case that the compression stress pattern 170 is formed from silicon-germanium, the second metal-semiconductor compound layer 195 may be metal-silicon-germanium compound.

Figure 21:
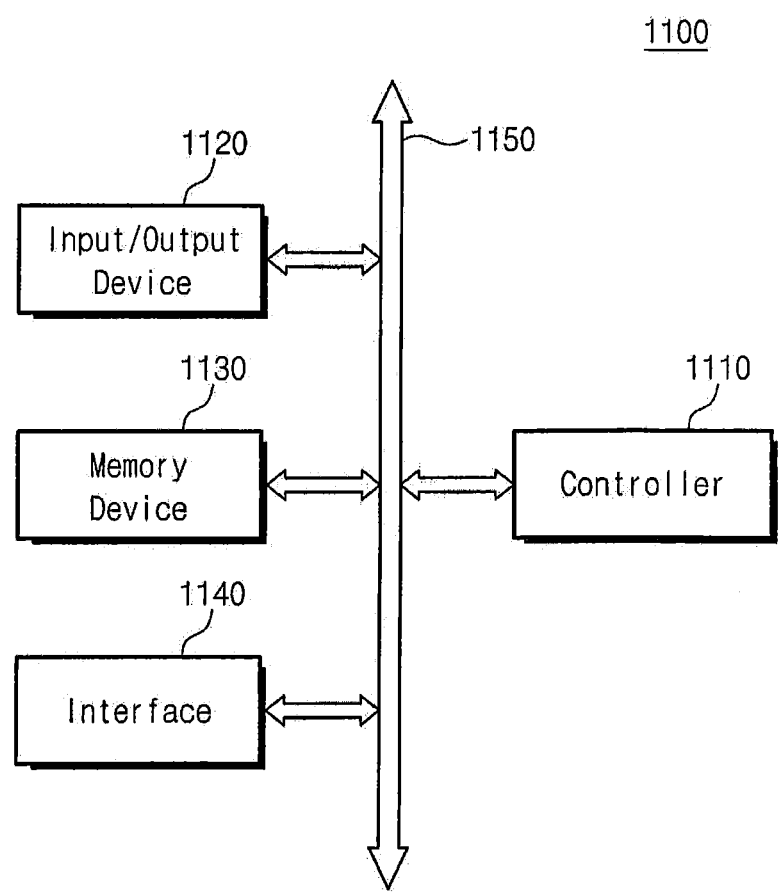
FIG. 21 is a block diagram of an electronic system including a semiconductor memory device in accordance with exemplary embodiments of the inventive concept.

FIG. 21 is a block diagram of an electronic system including a semiconductor memory device in accordance with exemplary embodiments of the inventive concept.

Referring to FIG. 21, an electronic system 1100 in accordance with exemplary embodiments of the inventive concept may include a controller 1110, an input/output device 1120, a memory device 1130, an interface 1140 and a bus 1150. The controller 1110, the input/output device 1120, the memory device 1130 and the interface 1140 may communicate with one another through the bus 1150. The bus 1150 corresponds to a path through which data may be transferred.

The controller 1110 may include at least one of a micro processor, a digital signal processor, a microcontroller and a logic device having a function similar to the micro processor, the digital signal processor and the microcontroller. The input/output device 1120 may include a keypad, a keyboard, a display device, etc. The memory device 130 may store data and/or instructions. The memory device 1130 may include at least one of semiconductor memory devices disclosed embodiments described herein. The memory device 1130 may further include a different type of semiconductor memory device (e.g., a flash memory device, a DRAM device and/or a SRAM device). The interface 1140 may transmit data to a communication network or receive data from the communication network. The interface 1140 may be a wireline type and or a wireless type. The interface 1140 may include an antenna or a wireline/wireless transceiver. Although not illustrated in the drawing, the electronic system 1100 may further comprise a high speed DRAM and/or a SRAM as an operation memory to improve an operation of the controller 1110.

The electronic system 1100 may be applied to a personal digital assistant (PDA), a portable computer, a web tablet, a wireless phone, a mobile phone, a digital music player, a memory card or all the devices that can transmit and/or receive data in a wireless environment.

According to embodiments of the inventive concept, an interlayer insulating film may be formed between gate structures without a void. When forming a contact hole, an over-etching may be reduced by controlling thicknesses of etching stop films formed on an NMOS region and a PMOS region.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents. Therefore, the above-disclosed subject matter is to be considered illustrative, and not restrictive.

What is claimed is:

1. A semiconductor device comprising:
   a first gate structure and a second gate structure on a substrate;
   a first source/drain region adjacent the first gate structure and a second source/drain region adjacent the second gate structure;
   a first etching stop film on the first source/drain region, the first etching stop film exposing an upper surface of the first gate structure;
   a second etching stop film on the second source/drain region, the second etching stop film exposing an upper surface of the second gate structure;
   a first contact plug that is electrically connected to the first source/drain region; and
   a second contact plug that is electrically connected to the second source/drain region,
   wherein a portion of the first etching stop film directly contacts the first source/drain region, and a portion of the second etching stop film directly contacts the second source/drain region, and
   wherein the portion of the first etching stop film comprises a top surface that is at a first level above a bottom surface of the substrate, the portion of the second etching stop film comprises a top surface that is at a second level above the bottom surface of the substrate, and the second level is different from the first level.

2. The semiconductor device of claim 1, wherein the first contact plug extends through the first etching stop film, and the second contact plug extends through the second etching stop film.

3. The semiconductor device of claim 1, wherein the first source/drain region is in an NMOS region of the semiconductor device, and the second source/drain region is in a PMOS region of the semiconductor device.

4. The semiconductor device of claim 3, wherein the first level is higher than the second level.

5. The semiconductor device of claim 3, wherein the first contact plug has a first vertical thickness in a direction that is perpendicular to the bottom surface of the substrate, the second contact plug has a second vertical thickness in the direction, and the first vertical thickness and the second vertical thickness are different.

6. The semiconductor device of claim 3, wherein each of the first and second gate structures comprises a gate pattern and a spacer pattern that is on a sidewall of the gate pattern.

7. The semiconductor device of claim 1, wherein the first etching stop film is on a sidewall of the first gate structure, and the second etching stop film is on a sidewall of the second gate structure.

8. The semiconductor device of claim 7, wherein the first contact plug extends through the first etching stop film, and the second contact plug extends through the second etching stop film.

9. A semiconductor device comprising:
   a first gate structure and a second gate structure on a substrate;
   a first source/drain region adjacent the first gate structure and a second source/drain region adjacent the second gate structure;
   a first etching stop film on the first source/drain region, the first etching stop film exposing an upper surface of the first gate structure;
   a second etching stop film on the second source/drain region, the second etching stop film exposing an upper surface of the second gate structure;
   a first contact plug that is electrically connected to the first source/drain region; and
   a second contact plug that is electrically connected to the second source/drain region,
   wherein the first etching stop film comprises a portion that extends along a sidewall of the first source/drain region, and the second etching stop film comprises a portion that extends along a top surface of the second source/drain region, and
   wherein the portion of the first etching stop film comprises a top surface that is at a first level above a bottom surface of the substrate, the portion of the second etching stop film comprises a top surface that is at a second level above the bottom surface of the substrate, and the second level is different from the first level.

10. The semiconductor device of claim 9, wherein the first level is higher than the second level.

11. The semiconductor device of claim 10, wherein the first etching stop film is on a sidewall of the first gate structure, and the second etching stop film is on a sidewall of the second gate structure.

12. The semiconductor device of claim 10, wherein the first contact plug extends through the first etching stop film, and the second contact plug extends through the second etching stop film.

13. The semiconductor device of claim 9, wherein the portion of the first etching stop film directly contacts the sidewall of the first source/drain region, and the portion of the second etching stop film directly contacts the top surface of the second source/drain region.

14. The semiconductor device of claim 9, wherein the first source/drain region and the second source/drain region have different conductivities.

15. A semiconductor device comprising:
   a first gate structure and a second gate structure on a substrate;
   a first source/drain region adjacent the first gate structure and a second source/drain region adjacent the second gate structure;

a first etching stop film on the first source/drain region, the first etching stop film exposing an upper surface of the first gate structure;

a second etching stop film on the second source/drain region, the second etching stop film exposing an upper surface of the second gate structure;

a first contact plug structure that is electrically connected to the first source/drain region; and a second contact plug structure that is electrically connected to the second source/drain region, wherein the first etching stop film comprises a portion that extends along a sidewall of the first source/drain region, and the portion of the first etching stop film comprises a top surface that is at a first level above a bottom surface of the substrate, and wherein the second etching stop film comprises a portion that is on a top surface of the second source/drain region and directly contacts the second contact plug structure, the portion of the second etching stop film comprises a top surface that is at a second level above the bottom surface of the substrate, and the second level is different from the first level.

16. The semiconductor device of claim 15, wherein the first level is higher than the second level.

17. The semiconductor device of claim 16, wherein the first etching stop film is on a sidewall of the first gate structure, and wherein the second etching stop film is on a sidewall of the second gate structure.

18. The semiconductor device of claim 16, wherein the first contact plug extends through the first etching stop film, and the second contact plug extends through the second etching stop film.

19. The semiconductor device of claim 15, wherein the first source/drain region and the second source/drain region have different conductivities.

20. The semiconductor device of claim 15, wherein each of the first and second contact plug structures comprises a contact plug and a metal-semiconductor compound on a lower surface of the contact plug.

* * * * *